(12) United States Patent
Kim et al.

(10) Patent No.: US 10,177,803 B2
(45) Date of Patent: Jan. 8, 2019

(54) MOBILE TERMINAL

(71) Applicant: LG Electronics Inc., Seoul (KR)

(72) Inventors: Euna Kim, Seoul (KR); Minsoo Kim, Seoul (KR); Youngil Kim, Seoul (KR); Byeonggi Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/640,845

(22) Filed: Jul. 3, 2017

(65) Prior Publication Data

US 2018/0019780 A1    Jan. 18, 2018

(30) Foreign Application Priority Data

Jul. 13, 2016    (KR) .................. 10-2016-0088465

(51) Int. Cl.
*H04B 5/00*  (2006.01)
*H04M 1/18*  (2006.01)
*H05K 1/02*  (2006.01)
*H05K 5/00*  (2006.01)
*H05K 5/02*  (2006.01)
(Continued)

(52) U.S. Cl.
CPC ..... *H04B 1/3888* (2013.01); *G06K 19/07777* (2013.01); *H04B 5/0031* (2013.01); *H04B 5/0081* (2013.01); *H04M 1/185* (2013.01); *H05K 1/028* (2013.01); *H05K 5/0086* (2013.01); *H05K 5/0247* (2013.01); *H05K 9/0081* (2013.01)

(58) Field of Classification Search
CPC .... H04B 1/3888; H05K 1/028; H05K 5/0086; H05K 5/0247; H05K 9/0081; H01Q 1/243; H01Q 1/2225; H01Q 1/40; H01Q 7/00; H01Q 1/38; H01Q 7/04; H01Q 1/48; H01Q 1/52; H01Q 19/062; G06K 19/07749; H01P 11/001
See application file for complete search history.

(56) References Cited

U.S. PATENT DOCUMENTS

2008/0231521 A1    9/2008  Anguera Pros et al.
2012/0176282 A1*   7/2012  Kato ................ G06K 19/07749
                                                                   343/702
(Continued)

FOREIGN PATENT DOCUMENTS

JP        2014-22909 A      2/2014
JP        2015-57921 A      3/2015
KR    10-2015-0051959 A     5/2015

*Primary Examiner* — Jianxun Yang
(74) *Attorney, Agent, or Firm* — Birch, Stewart, Kolasch & Birch, LLP (57) ABSTRACT

There is disclosed a mobile terminal comprising a rear case made of metal and forming an exterior of a rear surface of the mobile terminal, the rear case comprising a first slit; a reinforcing member made of a non-conductive material, coupled to a first region of the rear having the first slit, wherein the reinforcing member protrude inward of the rear case and form an uneven portion; a first conductive pattern coupled to an inner surface of the rear case and forming a cut-off region in the first region, the first conductive pattern formed in a ring shape; and a second conductive pattern provided in a corresponding shape to uneven portion of the reinforcing member and electrically connecting the cut-off region of the first conductive pattern.

20 Claims, 8 Drawing Sheets

(51) Int. Cl.
*H05K 9/00* (2006.01)
*G06K 19/077* (2006.01)
*H04B 1/3888* (2015.01)

(56) References Cited

U.S. PATENT DOCUMENTS

| | | | |
|---|---|---|---|
| 2012/0262357 A1* | 10/2012 | Kato | H01Q 1/38 343/788 |
| 2015/0009077 A1 | 1/2015 | Lee et al. | |
| 2015/0236401 A1* | 8/2015 | Yamaguchi | H01Q 1/243 343/702 |
| 2016/0110639 A1 | 4/2016 | Finn et al. | |

\* cited by examiner

MOBILE TERMINAL

CROSS-REFERENCE TO RELATED APPLICATIONS

Pursuant to 35 U.S.C. § 119(a), this application claims the benefit of earlier filing date and right of priority to Korean Application No. 10-2016-0088465, filed on Jul. 13, 2016, the contents of which are hereby incorporated by reference herein in their entirety.

BACKGROUND OF THE DISCLOSURE

Field of the Disclosure

Embodiments of the present disclosure relate to a mobile terminal which has a metal exterior appearance to provide an antenna.

Background of the Disclosure

NFC antenna is capable of performing short range wireless communication. Especially, such NFC antenna is overly weighed in a back side of a mobile terminal so as to bring a radiation effect toward the backside of the mobile terminal.

In case a rear case is made of metal, the wireless signal generated by the NFC antenna is unable to penetrate the rear case and travel outside because of the conductivity possessed by the metal.

Accordingly, the metal rear case could noticeably reduce the effect of the NFC antenna.

To solve such a disadvantage, such the metal rear case may include a slit for facilitating the passage of the wireless signal generated by the NFC antenna.

The wireless signals of the NFC antenna are transmitted in the form of waves. Even if the slit is relatively small, the diffraction of wavelengths allows the wireless signal of the NFC antenna having passed the slit to be transmitted with a sufficient wavelength.

Such the slit is filled with a non-conductive material. It is conventional that the thickness of the non-conductive material is equal to that of the rear case.

An outer surface of the rear case is exposed as an exterior design and conventionally forms the same surface with the exterior design. An inner surface has the NFC antenna attached thereto so that the inner surface has to form a flat surface.

However, when the thickness of the non-conductive material is equal to that of the rear case, the coupling area, in other words, the contact area between the rear case and the non-conductive material is not so sufficient to cause a problem of separation and deteriorate the stiffness of the rear case coupled to the non-conductive material.

SUMMARY OF THE INVENTION

An object of the present disclosure is to provide a mobile terminal which is able to minimize the performance degradation of the antenna provided in a metal rear case and the stiffness decrease of the rear case.

Embodiments of the present disclosure may provide a mobile terminal comprising a rear case made of metal and forming an exterior of a rear surface of the mobile terminal, the rear case comprising a first slit; a reinforcing member made of a non-conductive material, coupled to a first region of the rear case having the first slit, wherein the reinforcing member protrudes inward of the rear case and form an uneven portion; a first conductive pattern coupled to an inner surface of the rear case and forming a cut-off region in the first region, the first conductive pattern formed in a ring shape; and a second conductive pattern provided in a corresponding shape to uneven portion of the reinforcing member and electrically connecting the cut-off region of the first conductive pattern.

The second conductive pattern may be injection-molded and fixed to the first conductive pattern by Surface Mount Technology (SMT) manner.

The second conductive pattern may comprise phosphor bronze or stainless steel.

The second conductive pattern may be longer than a distance between of the cut-off region of the first conductive pattern.

The mobile terminal may further comprise a first flexible PCB having the first conductive pattern mounted thereon and coupled to an inner surface of the rear case; and an electromagnetic wave shield configured to cover the first flexible PCB.

The electromagnetic wave shield may be a Ferrite sheet.

The mobile terminal may further comprise a gold plating portion coated on the second conductive pattern.

The mobile terminal may further comprise an insulator configured to cover the second conductive pattern.

An outer surface of the reinforcing member and an outer surface of the rear case may form a same surface.

The mobile terminal may further comprise a rear camera unit; and an opening formed in the rear case and configured to expose the rear camera unit, wherein the first conductive pattern forms a ring shape around the opening.

The first conductive pattern may be an inductance wound several times, and the second conductive pattern may be provided in a plurality of lines and connected to the first conductive pattern.

The first conductive pattern and the second conductive pattern may configurate NFC antenna.

In accordance with at least one of the embodiments of the present disclosure, the mobile terminal has following effects.

Furthermore, the radiation performance of the antenna may not be degraded in the mobile terminal in accordance with at least one of the embodiments.

Furthermore, the mobile terminal in accordance with at least one of the embodiments may have a high coupling reliability between the first conductive pattern and the second conductive pattern.

Still further, the second conductive pattern in accordance with at least one of the embodiments is easier to process and treat.

Still further, the stiffness of the second conductive pattern may be relatively high in accordance with at least one of the embodiments.

Still further, electromagnetic interference generated in the antenna may not affect the other components provided in the rear case.

Effects obtainable from the present disclosure may be non-limited by the above mentioned effect. And, other unmentioned effects can be clearly understood from the following description by those having ordinary skilled in the technical field to which the present disclosure pertains.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. The above and other aspects, features and advantages of the present disclosure will become more apparent upon consideration of the following description of preferred embodiments, taken in conduction with the accompanying drawing figures. In the drawings.

DETAILED DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1A:
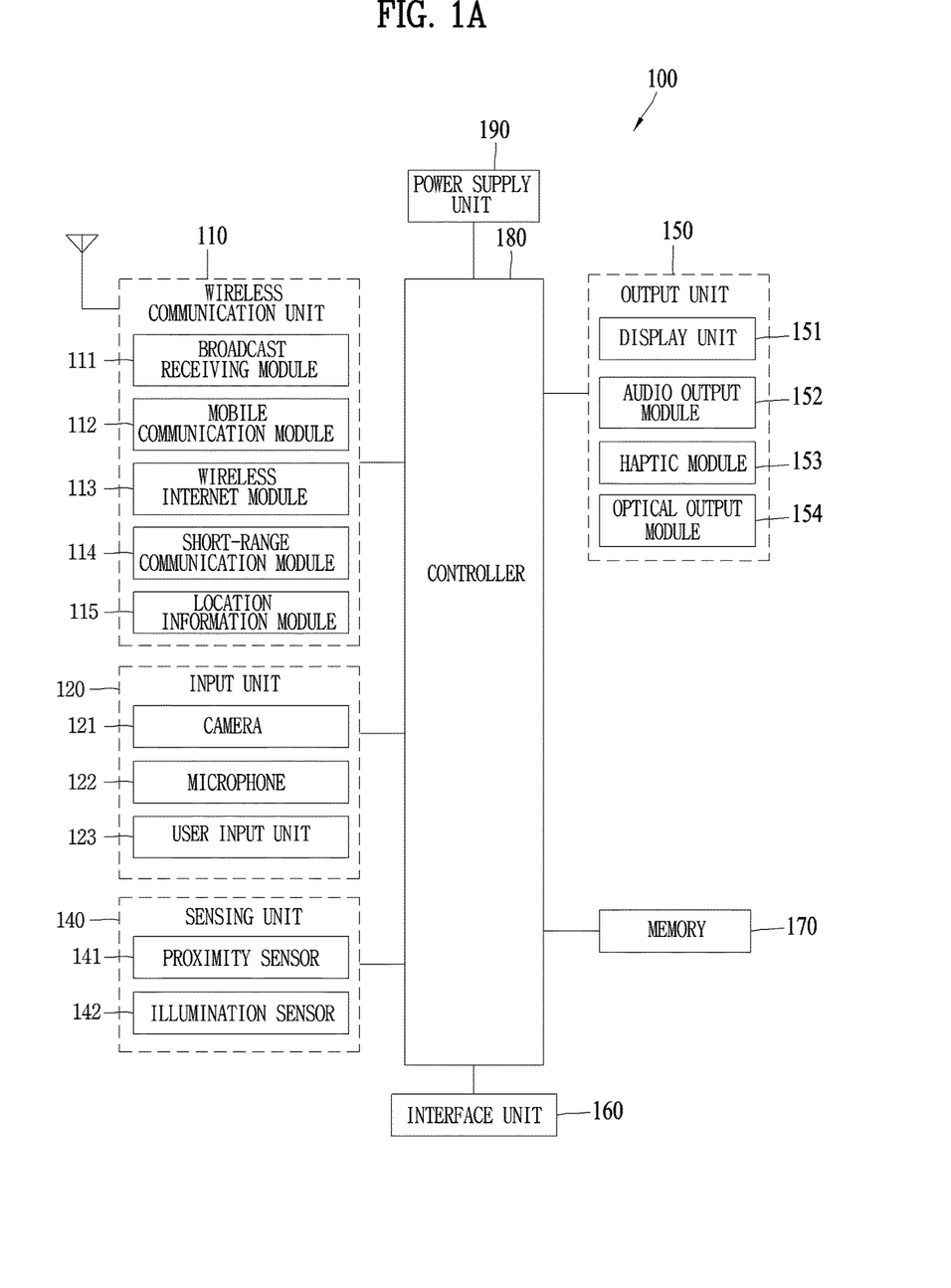
FIG. 1A is a block diagram of a mobile terminal associated with the present disclosure.
Figure 1B:
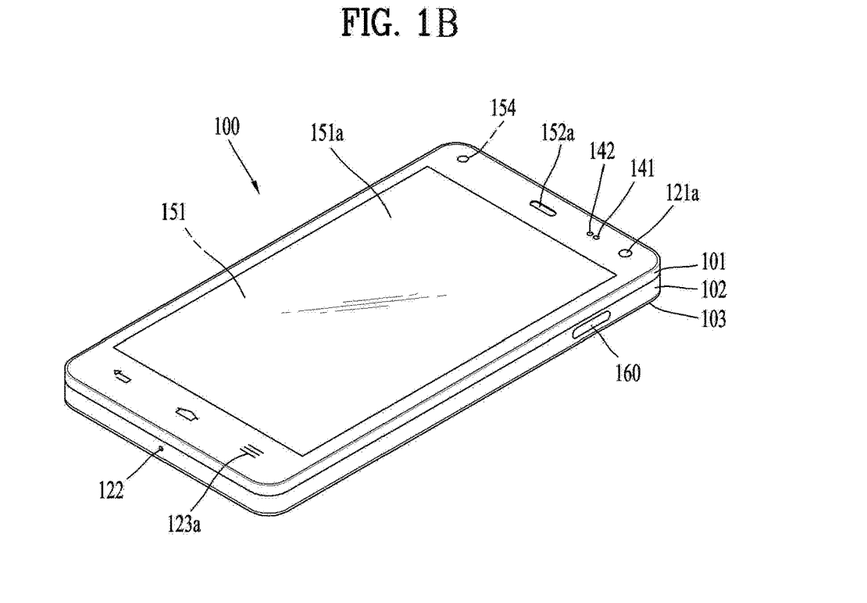
FIGS. 1B and 1C are conceptual views of one example of the mobile terminal, viewed from different directions.
Figure 1C:
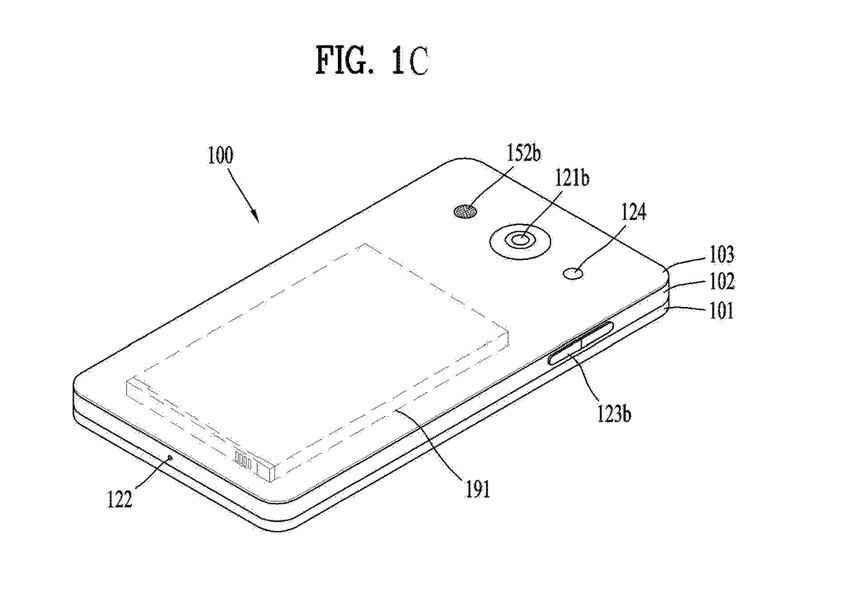

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

Referring now to FIG. 1A, the mobile terminal 100 is shown having wireless communication unit 110 configured with several commonly implemented components.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 processes signals, data, informations and the like inputted or outputted through the above-mentioned components and/or runs application programs saved in the memory 170, thereby processing or providing a user with appropriate informations and/or functions.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least one portion of the respective components mentioned in the foregoing description can cooperatively operate to embody operations, controls or controlling methods of the mobile terminal according to various embodiments of the present invention mentioned in the following description. Moreover, the operations, controls or controlling methods of the mobile terminal can be embodied in the mobile terminal by running at least one or more application programs saved in the memory 170.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

Referring now to FIGS. 1B and 1C, the mobile terminal 100 is described with reference to a bar-type terminal body. However, the mobile terminal 100 may alternatively be implemented in any of a variety of different configurations.

Examples of such configurations include watch-type, clip-type, glasses-type, or as a folder-type, flip-type, slide-type, swing-type, and swivel-type in which two or more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may be provided with the display unit 151, the first audio output unit 152a, the second audio output unit 152b, the proximity sensor 141, the illumination sensor 142, the optical output unit 154, the first camera 121a, the second camera 121b, the first manipulating unit 123a, the second manipulating unit 123b, the microphone 122, the interface unit 160, and the like.

FIGS. 1B and 1C depict certain components as arranged on the mobile terminal. However, it is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a BLUETOOTH™ port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

As shown in FIG. 1C, a flash 124 is shown adjacent to the second camera 121*b*. When an image of a subject is captured with the camera 121*b*, the flash 124 may illuminate the subject.

As shown in FIG. 1B, the second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can be also provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

As previously described with regard to FIG. 1A, the mobile terminal may be configured to include short-range communication techniques such as BLUETOOTH™, Radio Frequency Identification (RFID), Infrared Data Association (IrDA), Ultra Wideband (UWB), ZigBee, Near Field Communication (NFC), Wireless USB (Wireless Universal Serial Bus), and the like.

A typical NFC module provided at the mobile terminal supports short-range wireless communication, which is a non-contactable type of communication between mobile terminals and generally occurs within about 10 cm. The NFC module may operate in one of a card mode, a reader mode, or a P2P mode. The mobile terminal 100 may further include a security module for storing card information, in order to operate the NFC module in a card mode. The security module may be a physical medium such as Universal Integrated Circuit Card (UICC) (e.g., a Subscriber Identification Module (SIM) or Universal SIM (USIM)), a secure micro SD and a sticker, or a logical medium (e.g., embedded Secure Element (SE)) embedded in the mobile terminal. Single Wire Protocol (SWP)-based data exchange may be performed between the NFC module and the security module.

In a case where the NFC module operates in a card mode, the mobile terminal may transmit card information on a general IC card to the outside. More specifically, if a mobile terminal having card information on a payment card (e. g, a credit card or a bus card) approaches a card reader, a short-range mobile payment may be executed. As another example, if a mobile terminal which stores card information on an entrance card approaches an entrance card reader, an entrance approval procedure may start. A card such as a credit card, a traffic card, or an entrance card may be included in the security module in the form of applet, and the security module may store card information on the card mounted therein. Card information for a payment card may include any of a card number, a remaining amount and usage history, and the like. Card information of an entrance card may include any of a user's name, a user's number (e.g., undergraduate number or staff number), an entrance history, and the like.

When the NFC module operates in a reader mode, the mobile terminal can read data from an external tag. The data received from the external tag by the mobile terminal may be coded into the NFC Data Exchange Format defined by the NFC Forum. The NFC Forum generally defines four record types. More specifically, the NFC Forum defines four Record Type Definitions (RTDs) such as smart poster, text, Uniform Resource Identifier (URI), and general control. If the data received from the external tag is a smart poster type, the controller may execute a browser (e.g., Internet browser). If the data received from the external tag is a text type, the controller may execute a text viewer. If the data received from the external tag is a URI type, the controller may execute a browser or originate a call. If the data received from the external tag is a general control type, the controller may execute a proper operation according to control content.

In some cases in which the NFC module operates in a P2P (Peer-to-Peer) mode, the mobile terminal can execute P2P communication with another mobile terminal. In this case, Logical Link Control Protocol (LLCP) may be applied to the P2P communication. For P2P communication, connection may be generated between the mobile terminal and another mobile terminal. This connection may be categorized as a connectionless mode which ends after one packet is switched, and a connection-oriented mode in which packets are switched consecutively. For a typical P2P communication, data such as an electronic type name card, address information, a digital photo and a URL, a setup parameter for BLUETOOTH™ connection, Wi-Fi connection, etc. may be switched. The P2P mode can be effectively utilized in switching data of a small capacity, because an available distance for NFC communication is relatively short.

Figure 2:
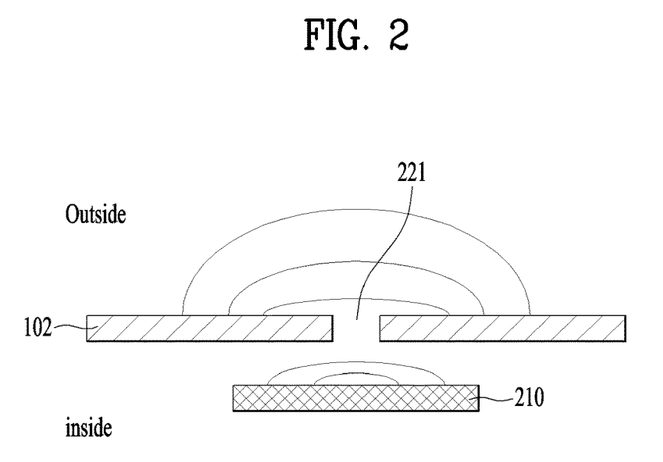
FIG. 2 is a sectional diagram of a conventional rear case and a conventional NFC antenna.

In case a NFC antenna 210 is mounted in the metal rear case 102, a wireless signal generated via the NFC antenna 210 is unable to penetrate the metal rear case 102 and travel outside because of the conductivity possessed by metal.

Accordingly, the metal rear case 102 is likely to deteriorate the effect of the NFC antenna 210.

FIG. 2 is a sectional diagram illustrating a conventional rear case 102 and a conventional NFC antenna 210.

To solve such a disadvantage, the metal rear case 102 may include a slit 221 for the passage of the signal of the NFC antenna 210.

The wireless signals of the NFC antenna are transmitted in the form of waves. Even if the slit is relatively small, the diffraction of wavelengths allows the wireless signal of the NFC antenna having passed the slit to be transmitted with a sufficient wavelength.

Figure 3:
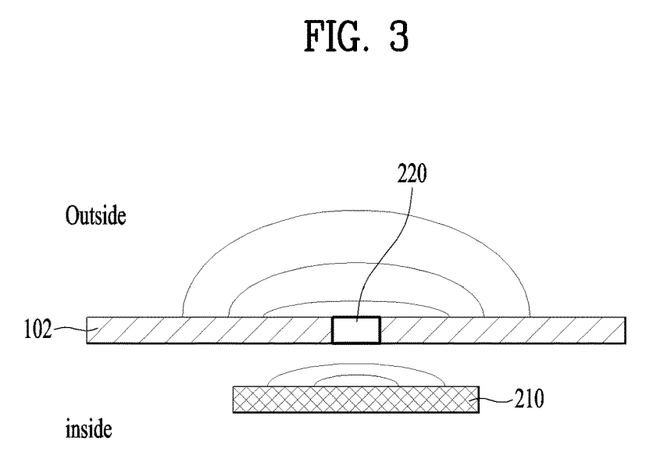
FIG. 3 is another sectional diagram of the conventional rear case and the conventional NFC antenna.

FIG. 3 is another sectional diagram illustrating the conventional rear case 102 and the conventional NFC antenna 210.

If the slit 221 is provided in the rear case 102 as it is, the overall stiffness of the mobile terminal 100 is likely to be degraded and foreign substances are likely to allow the empty space generated by the slit 221. Also, the external appearance could be damagingly affected in an aesthetic point of view. To solve such disadvantages, the slit 221 provided in the metal rear case 102 is filled with a non-conductive material 220.

The non-conductive material 220 needs to be fixed to the rear case 102. Such the non-conductive material 220 may be coupled to the rear case by an auxiliary material bonded by mold-injection or directly double-injected in the rear case 102.

It is conventional that the thickness of the non-conductive material 220 is equal to that of the rear case 102 near the non-conductive material 220, so that unevenness may not be generated in an outer or inner surface of the rear case 102 by the non-conductive material 220.

However, the non-conductive material 220 formed in the method mentioned above has a small coupling area, in other words, contact area with the rear case 102 and might cause a problem of separation from the rear case as well as a problem of stiffness deterioration of the rear case 102 having the non-conductive material coupled thereto.

Figure 4:
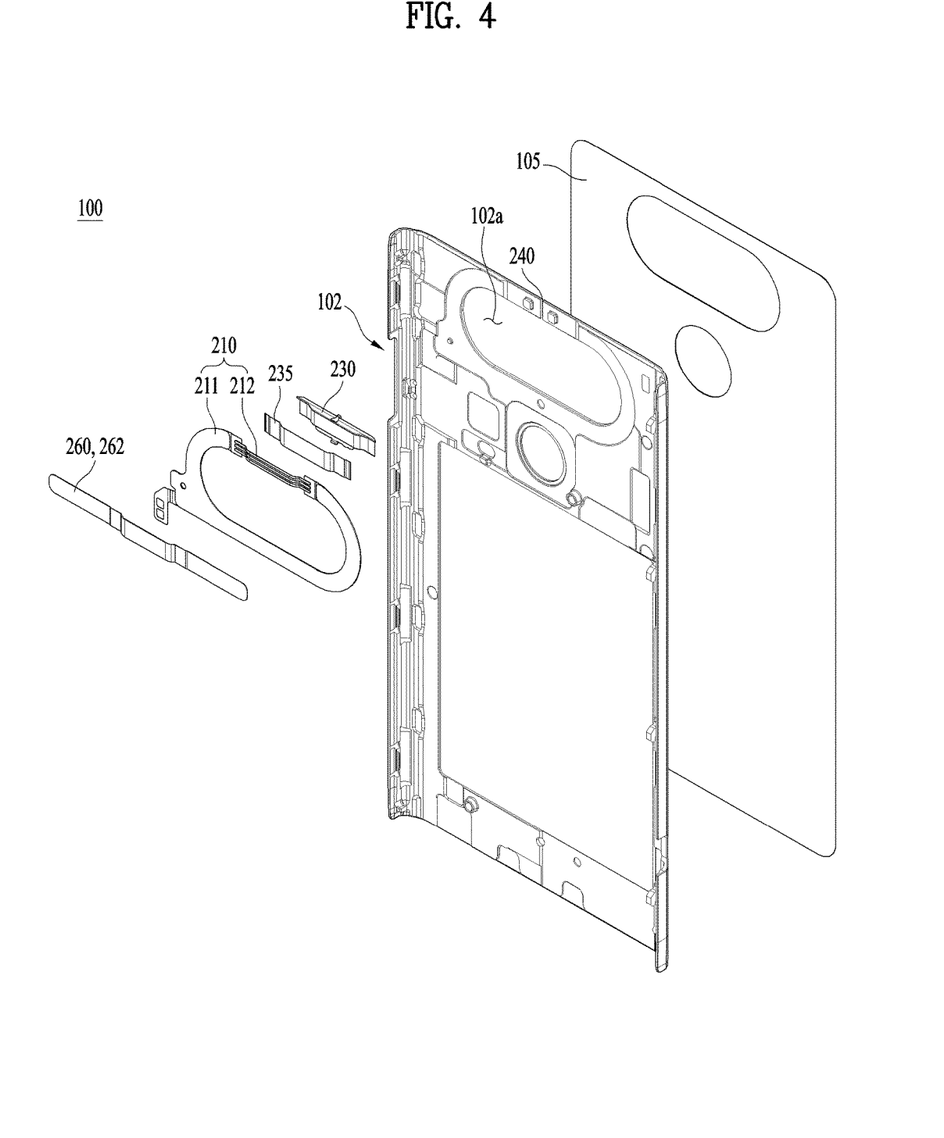
FIG. 4 is a partial exploded perspective diagram of a mobile terminal in accordance with the present disclosure.

FIG. 4 is a partial exploded perspective diagram of a mobile terminal in accordance with the present disclosure.

The technical features of the present disclosure are described under the premise that the mobile terminal 100 in accordance with the embodiments has no back cover 103. However, the technical features are not limited to the premise and applicable to the mobile terminal having the back cover 103.

Similar to that, the technical features of the present disclosure are applicable to a mobile terminal 100 having a detachable type battery or a mobile terminal 100 having a battery integrated therewith as one body.

In case an auxiliary back cover 103 is provided in the mobile terminal 100, the following technical features which will be described later may be realized in the back cover 103.

Even when the back cover 103 is provided, it is obvious that the technical features may be still applicable to the rear case 102 as occasion demands.

As mentioned above, the rear case 102 may define the exterior of the back side of the mobile terminal 100. The exterior of the back side only means an outer housing defining a rear surface of the mobile terminal 100, not necessarily limiting the housing provided in an outermost are of the mobile terminal.

If necessary, the technical features of the present disclosure may be realized in a front surface or a lateral surface of the mobile terminal, not the rear surface. In other words, the technical features may be realized in any housings only if the housings are located on the passage of the radiation performed by the NFC antenna 210 provided in the mobile terminal 100.

The rear case 102 may include a metallic material. Even though it is not necessary to make the rear case of metal, the present disclosure is provided to solve the problems caused in the rear case 102 made of a conductive material such as metal. The rear case 102 including a metallic material is applied so as to describe the technical features of the present disclosure.

A first slit 240 may be formed in the rear case 102. One end of the first slit 240 is connected to an opening 102a formed in the rear case 102 or independently distant from the opening 102a.

The opening 102a is configured to expose a rear camera to the back side of the mobile terminal 100.

Figure 5:
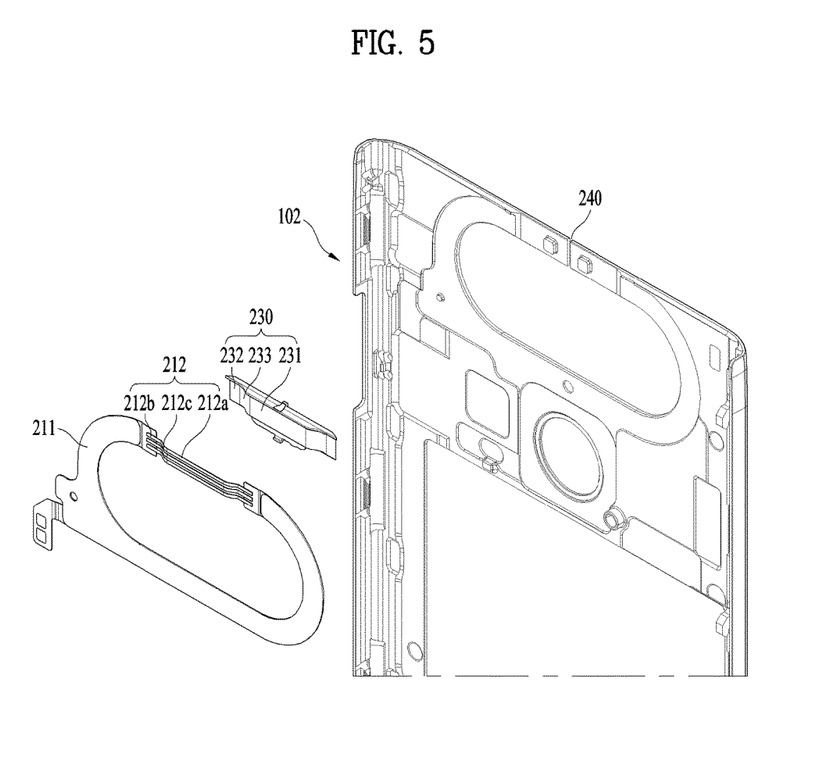
FIG. 5 is a partial exploded perspective diagram of a mobile terminal in accordance with the present disclosure.
Figure 6:
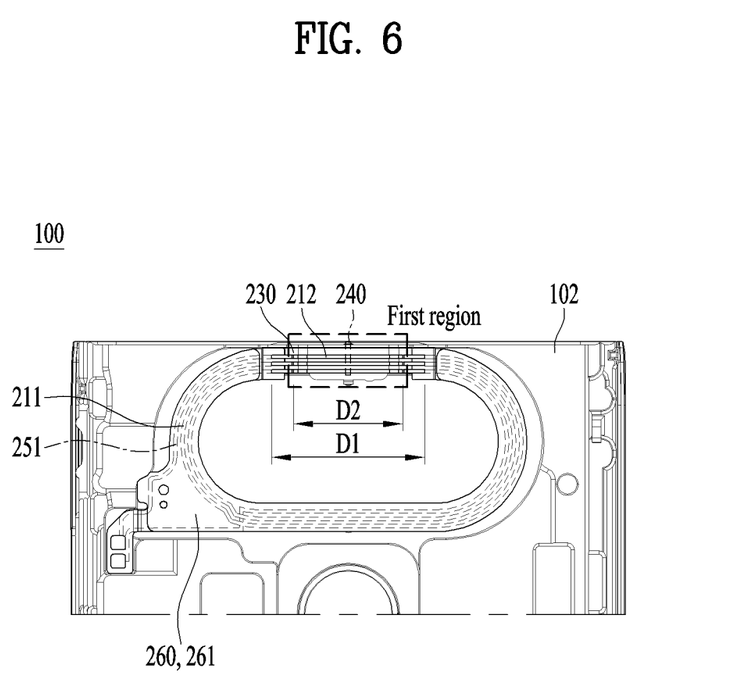
FIG. 6 is a front view partially illustrating a coupling portion of the mobile terminal.

FIG. 5 is a partial exploded perspective diagram of the mobile terminal 100 in accordance with the present disclosure and FIG. 6 is a front view partially illustrating a coupling portion of the mobile terminal 100.

The NFC antenna 210 may include a first conductive pattern 211 and a second conductive pattern 212. The NFC antenna 210 may form a ring shape around the opening 102a. In other words, the first and second conductive patterns 211 and 212 may form some parts of the ring shape.

The rear case 102 including the first slit 240 may be fabricated in an injection molding manner or cut or processed in a cutting manner with an NC(Numerical Control) work process.

The first slit 240 has a linear shape formed straight in one direction, with a regular width. The direction in which the first slit 240 is formed straight may be a vertical direction in the mobile terminal 100.

The first slit 240 may be formed to become corresponding to the width of the first conductive pattern area 211 which will be described later, that is, the NFC antenna 210 and need not be formed over the entire area of a diameter in one direction of the NFC antenna 210.

A reinforcing member 230 may be projected from a first region having the first slit 240 of the rear case 102 inward of the rear case 102. The reinforcing member 230 may be formed of a non-conductive material and configured to allow a magnetic field generated in the NFC antenna 210 to be radiated outside without becoming blocked. Also, the reinforcing member 230 may be employed to fill an opening which is formed in the rear case.

The reinforcing member 230 may be coupled to the first region of the rear case 102. An auxiliary material injected in a mold is bonded to the metal rear case 102 as the non-conductive reinforcing member 230. In other words, a bonding material may be applied to the area wherein the reinforcing member 230 and the rear case 102 are in contact.

If necessary, the non-conductive material may be directly double-injected in the first region of the rear case 102 to form the reinforcing member 230.

Such the reinforcing member 230 may form an uneven portion. In other words, the reinforcing member 230 may have a stepped or curved inner area. In case the non-conductive material 220 is provided only in the slit 221 as shown in FIG. 3, the contact area with the rear case 102 is so small that the separation of the non-conductive material 220 can occur easily. Also, such the small contact area of the non-conductive material 220 is insufficient to compensate the stiffness deterioration of the rear case generated by the slit 221.

Accordingly, to reinforce the overall stiffness of the rear case and to prevent the separation of the reinforcing member 230, the reinforcing member 230 may be more projected inward than an inner surface of the rear case 102 so as to form a certain thickness of a predetermined value or more. Especially, the thickness of the reinforcing member 230 may be 0.8 mm or more.

The reinforcing member 230 may be continuously formed from an extended surface 232 which starts at the same height as the inner surface of the rear case 102 to a stepped surface 231 projected toward the internal space of the rear case 102. To realize a natural shape to the stepped surface 231, the reinforcing member 230 may include an inclined surface 233.

The inclined surface 233 of the reinforcing member 230 may be formed as climbing over the reinforcing member 230 from the inner surface of the rear case naturally. The reinforcing member 230 has the shape for minimizing the sharply projected area so as to reduce the possibility that the second conductive pattern 212 become damaged and allow the second conductive pattern 212 when attached to the reinforcing member 230 to be drastically bent.

The first conductive pattern 211 may be coupled to the second conductive pattern 212 to serve as the NFC antenna 210 together with the second conductive pattern 212. In this instance, the NFC antenna 210 is one of embodiments and they may serve as other types of antennas within the technical features of the present disclosure.

The first conductive pattern 211 may have a ring shape which forms a cut-off region in the first region. In other words, the second conductive pattern 212 is provided in the first region where the reinforcing member 230 is located and the first conductive pattern 211 is provided in the other region except the first region so as to realize the ring-shaped pattern of the NFC antenna 210.

The second conductive pattern 212 may be electrically connected to the cut-off region of the first conductive pattern 211.

The second conductive pattern 212 may have a corresponding shape to the reinforcing member 230. Specifically, the second conductive pattern 212 may have a similar inclination and area to the stepped surface 231 and the inclined surface 233, to contact with or get closer to the reinforcing member 230 as much as possible.

The second conductive pattern 212 puts priority on the role for connecting the region where the first conductive pattern 211 cannot be provided on one flat surface because of the reinforcing member 230 to the other region and it does not have to be in contact with the reinforcing member 230.

The second conductive pattern 212 may include a conductive material with certain stiffness, especially, a metallic material. The second conductive pattern unit 212 may be formed in an injection molding manner.

The second conductive pattern 212 may include phosphor bronze or stainless steel (STS). Phosphor bronze is so soft to have an advantage of easy fabrication. In case sufficient stiffness is required, stainless steel may be used.

The injection-molded second conductive pattern 212 may include an upper portion 212a corresponding to the stepped surface 231 of the reinforcing member 230; a lower portion 212b in contact with the first conductive pattern 211; and an inclined portion 212c connecting the upper portion 212a and the lower portion 212b with each other. The inclination of the inclined portion 212c may be regular or the inclined portion 212c may gently bend to connect the upper and lower portions 212a and 212c with each other.

Both ends of the injection-molded second conductive pattern 212 may be electrically connected to both sides of the cut-off region of the first conductive pattern 211, respectively. The injection-molded second conductive pattern 212 may be fixed to the first conductive pattern 211 by Surface Mount Technology (SMT). One typical example of SMT may be soldering.

The first and second conductive patterns 211 and 212 fixed by SMT may have a high coupling reliability.

The first conductive pattern 211 may be employed as inductance formed of inductance coils wound several times. The second conductive pattern 212 may include a plurality of pattern lines corresponding to the first conductive pattern 211. Accordingly, the electrical connection between the first and second conductive patterns 211 and 212 may function as the conventional inductance continuously wound several times.

To improve the contact reliability of the first and second conductive patterns 211 and 212, the second conductive pattern 212 may have a spare length. In other words, a distance (D1) corresponding to the overall length of the second conductive pattern 212 is longer than a distance (D2) between the sides of the cut-off region of the first conductive pattern 211, so that the second conductive pattern 212 can be connected to an inner portion from both ends of the first conductive pattern 211.

The first conductive pattern portion 211 may be mounted in a flexible printed circuit board (FPCB). The FPCB in which the first conductive pattern 211 is mounted may be defined as a first flexible PCB 251.

The first flexible PCB 251 having the first conductive pattern 211 may be sealed in a direction toward the inner space of the rear case 102 by an electromagnetic wave shield 260.

The electromagnetic wave shield 260 may shield electromagnetic interference such as eddy current which is generated in the NFC antenna 210 from affecting other components. One typical example of the electromagnetic wave shied 260 may be a Ferrite Sheet 261. The Ferrite sheet 261 may include a thin ceramic material.

A bonding material is applied to an inner surface of the electromagnetic wave shield 260 so as to seal the first flexible PCB 251 having the first conductive pattern 211 and fix it to the rear case 102 without separation.

The second conducive pattern portion 212 may be secured to the first flexible PCB 251 having the first conductive pattern 211 by SMP and adhered to the reinforcing member 230 by an adhesive tape 235 to prevent separation or coming-off.

A gold plating portion is coated on the second conductive pattern 212 to prevent corrosion.

Simultaneously referring to FIG. 4, An insulator 262 is a kind of the electromagnetic wave shield 260 and operates as a similar role to the Ferrite sheet 261. In other words, the insulator 262 may allow the second conductive pattern 212 to be coupled to the reinforcing member 230 and the rear case 102 stably and function to shield the electromagnetic interference generated from the NFC antenna 210 from badly influencing internal components of the rear case 102.

Such the insulator 262 may have a certain size corresponding to the second conductive pattern unit 212. Both ends of the insulator 262 are able to cover some area of the Ferrite sheet 261 sufficiently to improve the reliability of the electromagnetic shield performed by the overall NFC antenna 210.

Figure 7:
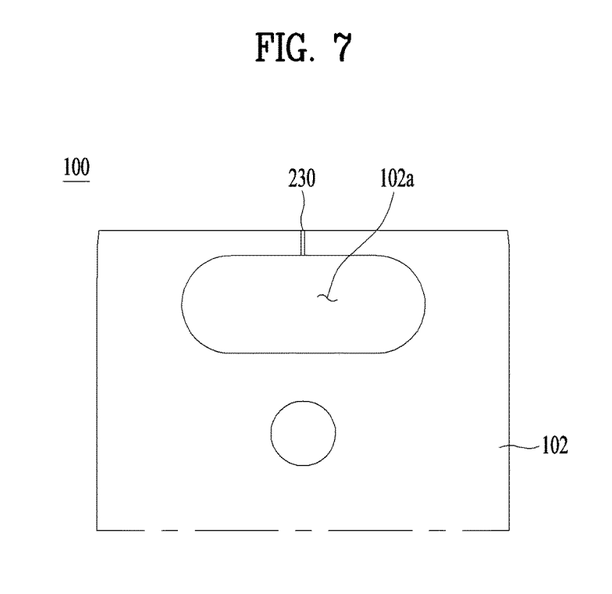
FIG. 7 is a perspective diagram of a rear case in accordance with one embodiment of the present disclosure.

FIG. 7 is a rear perspective diagram of the rear case in accordance with the present disclosure.

An outer surface of the reinforcing member 230 and an outer surface of the rear case 102 may form the same surface, so that the rear surface of the mobile terminal 100 may form a same surface with no projection to prevent foreign substances from moving in the rear case 102 or becoming stuck in an edge or border of the rear case 102. Also, the possibility of the reinforcing member 230 separating from the rear case 102 which is caused by an external shock may be minimized and the uniformity between the reinforcing member 230 and the rear case 102 may be enhanced.

The reinforcing member 230 may be made of the different material from the rear case 102 but painted with the similar or same color to or as the rear case 102. Accordingly, the mutual difference between the reinforcing member 230 and the rear case 102 may be minimized.

Figure 8:
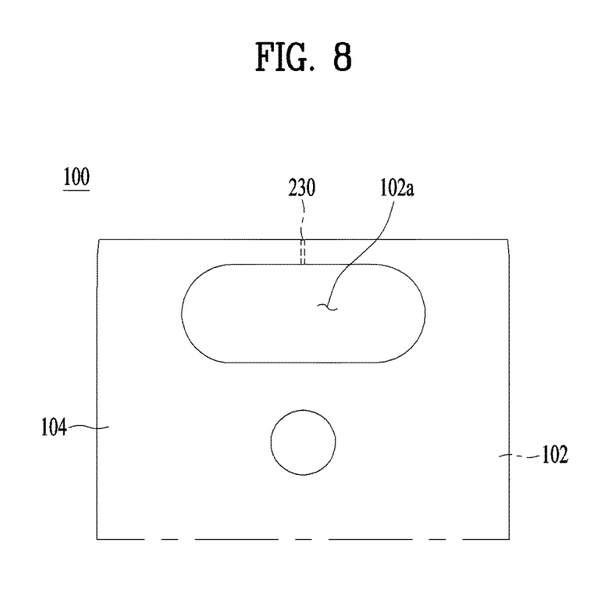
FIG. 8 is a perspective diagram of a rear case in accordance with another embodiment of the present disclosure.

FIG. 8 is a perspective diagram of a rear case in accordance with another embodiment of the present disclosure.

A coating layer 104 may be coupled to a rear surface of the rear case 102 as occasion demands. The coating layer 104 may include an opaque material.

The coating layer 104 made of the opaque material is configured to cover the rear surface of the rear case 102 to make the reinforcing member 230 invisible from outside. In other words, the mutual difference between the reinforcing member 230 and the rear case 102 may be minimized.

The coating layer 104 may include a non-conductive material. Especially, the coating layer 104 may include an anodized metallic material.

The coating layer 104 is sprayed like paint and attached to the rear surface of the rear case 102. In case the coating layer 104 is anodized, the rear case 102 having the reinforcing member 230 coupled thereto may be coated in the anodizing process.

Referring to FIG. 4 again, a protection layer 105 may be provided in an outermost surface of the rear case 102. The protection layer 105 may minimize scratches by covering the exterior of the rear case 102 and be a transparent film type. Also, the protection layer 105 may have an adhesive material provided in an inner surface to be adhered to the rear case 102 like an adhesive tape.

As described above in the embodiment, the second conductive pattern 212 may be injection-molded and SMT-mounted in the first conductive pattern 211. However, another type of the conductive pattern may be provided as occasion demands.

Figure 9:
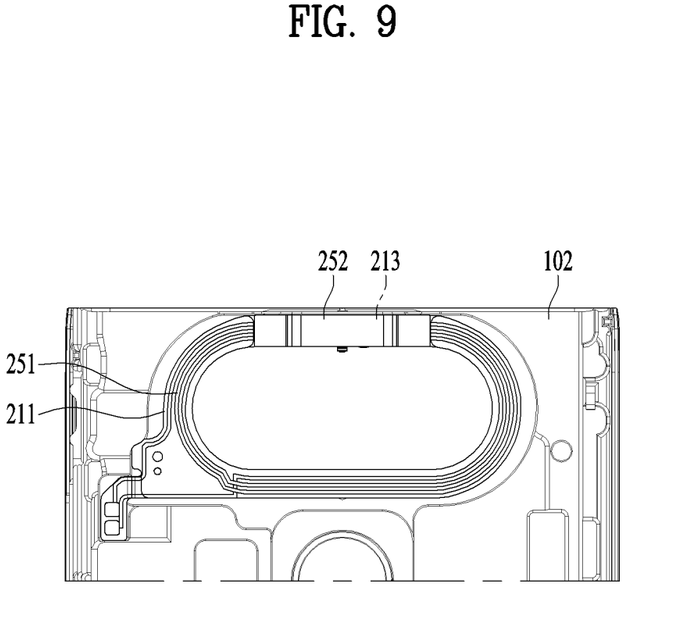
FIG. 9 is a perspective diagram partially illustrating a coupling portion of another example of the mobile terminal.

FIG. 9 is a perspective diagram partially illustrating a coupling portion of another example of the mobile terminal 100.

The second conductive pattern 212 in accordance with the previous embodiment is replaced by a third conductive patter 213 in accordance with the illustrated embodiment. In other words, the first conductive patter 211 and the third conductive patter 213 are coupled to each other only to realize the NFC antenna 210.

The third conductive pattern 213 may be realized in a flexible printed circuit board (FPCB). The FPCB where the third conductive pattern 213 is mounted is defined as a second flexible PCB 252. The third conductive pattern 252 mounted in the second flexible PCB 252 may be electrically connected to the first conductive pattern 211 of the first flexible PCB 251.

The second flexible PCB 252 may connect the blocked regions of the first flexible PCB 251. Different from the previous embodiment, the second flexible PCB 252 may be flexible.

The second conductive patter 212 mounted in the second flexible PCB 252 may be longer than the distance between ends of the blocked region formed in the first conductive pattern 211.

The first flexible PCB 251 and the second flexible PCB 252 may be connected to each other in a heat fusion manner, so that the first conductive pattern 211 and the third conductive pattern 213 can be electrically connected to each other.

The other configuration and features of the illustrated embodiment are equal to those of the previous embodiment, except what is described just above.

It will be appreciated by those skilled in the art that the present invention can be specified into other form(s) without departing from the spirit or scope of the inventions.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile terminal comprising:
   a case defining at least a portion of an exterior of the mobile terminal;
   a slit provided in a region of the case;
   a reinforcing member coupled to an inner surface of the region of the case, the reinforcing member filling in the slit, the reinforcing member being made of a non-conductive material, the reinforcing member protruding inward of the case and having an uneven portion at an inner surface of the reinforcing member;
   a first conductive pattern coupled to an inner surface of the case and having two separated ends that define a cut-off region at the region of the case, the first conductive pattern having a ring shape; and
   a second conductive pattern electrically connecting the two separated ends of the first conductive pattern that define the cut-off region, the second conductive pattern having a shape that corresponds to a shape of the uneven portion of the reinforcing member.

2. The mobile terminal of claim 1, wherein the second conductive pattern is injection-molded and fixed to the first conductive pattern by Surface Mount Technology (SMT).

3. The mobile terminal of claim 2, wherein the second conductive pattern comprises phosphor bronze or stainless steel.

4. The mobile terminal of claim 1, wherein the second conductive pattern is longer than a distance between the two separated ends of the first conductive pattern that define the cut-off region.

5. The mobile terminal of claim 1, further comprising:
   a first flexible printed circuit board (FPCB) having the first conductive pattern located thereon and coupled to the inner surface of the case; and
   an electromagnetic wave shield configured to cover the first FPCB.

6. The mobile terminal of claim 5, wherein the electromagnetic wave shield is a ferrite sheet.

7. The mobile terminal of claim 5, further comprising a second FPCB having the second conductive pattern located thereon.

8. The mobile terminal of claim 1, further comprising a gold plating portion coated on the second conductive pattern.

9. The mobile terminal of claim 1, further comprising an insulator configured to cover the second conductive pattern.

10. The mobile terminal of claim 1, wherein an outer surface of the reinforcing member and an outer surface of the case are coplanar.

11. The mobile terminal of claim 1, wherein the case is a rear case made of metal.

12. The mobile terminal of claim 11, further comprising a rear camera, wherein the rear case includes an opening configured to expose the rear camera, and
wherein the first conductive pattern is located around the opening.

13. The mobile terminal of claim 1, wherein the first conductive pattern is an inductance wound several times, and
wherein the second conductive pattern includes a plurality of lines connected to the first conductive pattern.

14. The mobile terminal of claim 1, wherein the first conductive pattern and the second conductive pattern provide a Near Field Communication (NFC) antenna.

15. The mobile terminal of claim 1, further comprising a protection layer on an outermost surface of the case, the protection layer being a transparent film.

16. The mobile terminal of claim 1, further comprising a coating layer on an outermost surface of the case, the coating layer including an anodized metallic material.

17. A mobile terminal comprising:
a front case;
a display located at the front case;
a rear case defining an exterior of a rear surface of the mobile terminal;
a slit provided in a region of the rear case;
a reinforcing member coupled to an inner surface of the region of the rear case, the reinforcing member filling in the slit, the reinforcing member being made of a non-conductive material, the reinforcing member having a first portion located in the slit and a second portion protruding inward of the rear case, the second portion having an uneven portion at an inner surface of the reinforcing member;
a first conductive pattern coupled to an inner surface of the rear case and having two separated ends that define a cut-off region at the region of the rear case, the first conductive pattern having a ring shape; and
a second conductive pattern electrically connecting the two separated ends of the first conductive pattern that define the cut-off region, the second conductive pattern having a shape that corresponds to a shape of the uneven portion of the reinforcing member.

18. The mobile terminal of claim 17, wherein the rear case is made of metal.

19. The mobile terminal of claim 17, wherein the first conductive pattern and the second conductive pattern provide a Near Field Communication (NFC) antenna.

20. The mobile terminal of claim 17, further comprising a rear camera,
wherein the rear case includes an opening configured to expose the rear camera, and
wherein the first conductive pattern is located around the opening.

* * * * *